United States Patent
Torres et al.

(10) Patent No.: US 7,215,150 B2
(45) Date of Patent: May 8, 2007

(54) METHOD AND CIRCUIT FOR MAINTAINING I/O PAD CHARACTERISTICS ACROSS DIFFERENT I/O SUPPLY VOLTAGES

(75) Inventors: Cynthia A. Torres, Austin, TX (US); Lloyd P. Matthews, Buda, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 179 days.

(21) Appl. No.: 11/047,427

(22) Filed: Jan. 31, 2005

(65) Prior Publication Data

US 2006/0170455 A1 Aug. 3, 2006

(51) Int. Cl.
*H03K 19/0175* (2006.01)
*H03K 3/00* (2006.01)

(52) U.S. Cl. .............................. 326/83; 326/80; 326/81; 327/112; 327/333

(58) Field of Classification Search ................ 327/112, 327/333; 326/83
See application file for complete search history.

(56) References Cited

U.S. PATENT DOCUMENTS

| | | | |
|---|---|---|---|
| 5,300,835 A | | 4/1994 | Assar et al. |
| 5,894,423 A | | 4/1999 | Ling et al. |
| 6,160,430 A | * | 12/2000 | Drapkin et al. ............. 327/143 |
| 6,512,401 B2 | * | 1/2003 | Clark et al. ................. 327/112 |
| 6,815,998 B1 | * | 11/2004 | Samad ....................... 327/530 |
| 7,023,238 B1 | * | 4/2006 | Camarota .................... 326/38 |
| 2003/0122574 A1 | | 7/2003 | Kushida |
| 2004/0145388 A1 | | 7/2004 | Gallo et al. |
| 2005/0046449 A1 | * | 3/2005 | Davis ......................... 327/112 |
| 2005/0077929 A1 | * | 4/2005 | Egerer et al. ............... 327/112 |

FOREIGN PATENT DOCUMENTS

WO WO 97/21273 6/1997

* cited by examiner

*Primary Examiner*—Vibol Tan
(74) *Attorney, Agent, or Firm*—Robert L. King; Michael J. Balconi-Lamica

(57) ABSTRACT

A circuit implements a method to adjust input/output (I/O) characteristics of an I/O pad circuit (10) depending upon which value of an I/O supply voltage is used within a range of supply voltages. An I/O supply voltage being supplied to the pad circuit is detected by detecting (18, 20) its value relative to a known reference (16). Portions of the I/O pad circuit are selectively enabled in response to the detected I/O supply voltage. By selecting the ratio of P-channel and N-channel transistors, physical characteristics of the circuit are controlled. Examples of the controlled physical characteristics include slew rate, signal rise and fall times, and duty cycle control which is controlled by forcing all rising and falling edges to have a midpoint at the same point in time. Therefore a same I/O pad circuit may be optimally used in numerous applications regardless of the supply voltage value.

17 Claims, 3 Drawing Sheets

METHOD AND CIRCUIT FOR MAINTAINING I/O PAD CHARACTERISTICS ACROSS DIFFERENT I/O SUPPLY VOLTAGES

FIELD OF THE INVENTION

This invention relates to electronic circuits, and more particularly to electronic circuitry for interfacing with various voltage values.

BACKGROUND OF THE INVENTION

Integrated circuits typically have peripheral or input/output (I/O) circuitry and internal core circuitry. The cores of the integrated circuit perform various processing-specific functions and are desired to operate as fast as possible with minimal power consumption. As a result, power supply voltages that are used to power the core circuitry have been getting smaller with the enhancement of semiconductor processing. The I/O circuitry however functions to provide circuit drive strength to drive or provide signals from the core to external sources at a specified signal power. The I/O circuitry also is frequently required to interface with various interface standards. As different voltages are received at an I/O terminal or pad, the I/O electrical characteristics are varied. For example, the rise and fall signal characteristics vary as well as signal propagation times. The variability of the electrical characteristics results in variable performance. As a result, a circuit must be designed with a large amount of timing tolerance to account for the unpredictable signal and timing changes in response to differing I/O voltages.

Numerous circuits are known for changing the drive capability of buffers or buffer strength of buffers that connect to integrated circuit pins such as an I/O pad. However, the known circuits function to adjust drive strength in response to the amount of impedance connected to an integrated circuit pin or configure a fixed amount of buffer drive strength. Such techniques do not generally respond to operational changes encountered as a result of the size of the voltage range used for the output buffer signals.

Other circuits are known for changing the voltage handling capability of output buffers. For example, in U.S. Pat. No. 5,300,835 a circuit that interfaces between signals at 3.3 volts and 5.0 volts is used wherein a bidirectional buffer performs voltage translation between two distinct voltage levels depending upon the direction of the signal transmission. Such circuits perform voltage translation between two designed fixed voltage values and are limited in operation at other voltages, especially lower voltages than a minimum voltage value.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION

Figure 1:
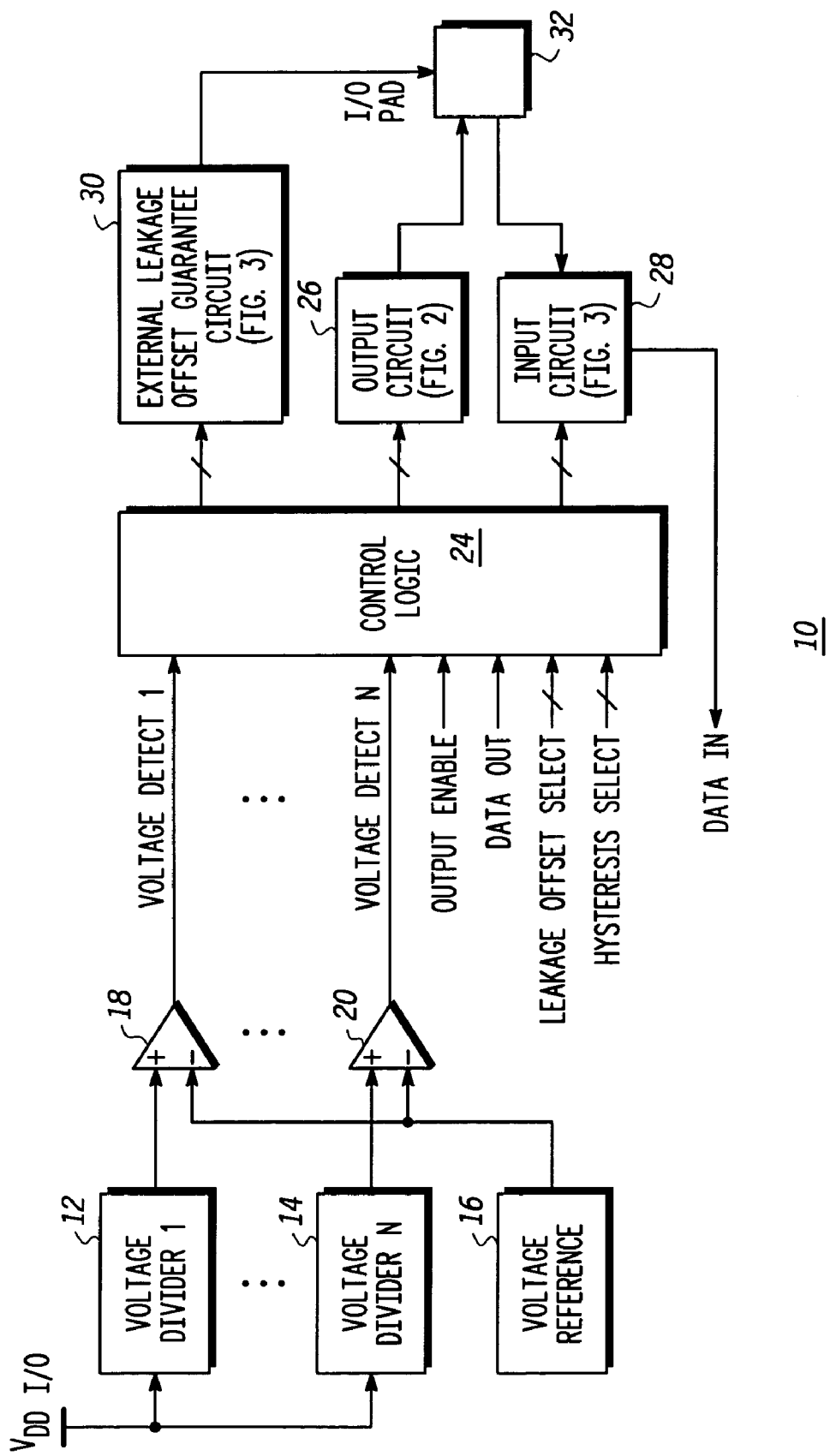
FIG. 1 illustrates in block diagram form a circuit in accordance with one form of the present invention.

FIG. 1 illustrates a buffer in the form of an (input/output) I/O pad circuit 10 in accordance with one form of the invention. I/O pad circuit 10 has a plurality of voltage divider circuits, such as a first voltage divider 12 and an Nth voltage divider 14, where N is an integer. Each of the voltage divider circuits is connected to an I/O power supply voltage labeled $V_{DD}$ I/O. A corresponding plurality of N comparators is also provided, such as a comparator 18 and a comparator 20. An output of voltage divider 12 is connected to a first input of comparator 18. An output of voltage divider 14 is connected to a first input of comparator 20. Any number of voltage divider circuits and corresponding comparators may be implemented as is indicated by the intervening dots in FIG. 1. A voltage reference circuit 16 has an output connected to a second input of each of comparator 18 and comparator 20. In one form the voltage reference circuit 16 is implemented as a bandgap reference voltage, but it should be understood that any of numerous known reference voltage circuits may be used. An output of comparator 18 provides a first voltage detection signal labeled "Voltage Detect 1" and is connected to a first input of control logic 24. An output of comparator 20 provides an Nth voltage detection signal labeled "Voltage Detect N" and is connected to a second input of control logic 24. An Output Enable signal is connected to a third input of control logic 24. A Data Out signal is connected to a fourth input of control logic 24. A Leakage Offset Select signal is connected to a fifth input of control logic 24. A Hysteresis Select signal is connected to a sixth input of control logic 24. A first output of control logic 24 is connected to an input of an output circuit 26 which is detailed further in FIG. 2. A second output of control logic 24 is connected to an input of an input circuit 28 which is detailed further in FIG. 3. A third output of control logic 24 is connected to an input of an external leakage offset guarantee circuit 30 which is also detailed further in FIG. 3. An output of each of the output circuit 26 and the external leakage offset guarantee circuit 30 is connected to an I/O pad 32. The I/O pad 32 is connected to an input of an input circuit 28. An output of the input circuit 28 provides data labeled "Data In".

In operation, the I/O pad circuit 10 functions to both provide the Data Out signal to the I/O pad 32 and to receive input data labeled as "Data In". The Output Enable signal controls the timing of when the I/O pad 32 is in an output mode for outputting data. When the Output Enable signal is not asserted, the I/O pad 32 is placed in a conventional tri-state condition by circuitry (not shown) under control of control logic 24. I/O pad circuit 10 is designed so that the propagation delay between logic transitions of the input data and the Data Out signal is constant regardless of what value of voltage is used for $V_{DD}$ I/O and regardless of how the $V_{DD}$ I/O voltage varies.

The voltage reference circuit 16 provides a predetermined fixed reference voltage value. The N voltage dividers each divide the supply voltage $V_{DD}$ I/O supply voltage by a predetermined different divisor. Each divided voltage from the $V_{DD}$ I/O supply voltage is compared with the voltage reference. If the divided $V_{DD}$ I/O supply voltage value is less than the voltage reference, the respective comparator will not assert its respective voltage detect signal by outputting a logic low. If the divided $V_{DD}$ I/O supply voltage is greater than the voltage reference, the respective comparator will assert its respective voltage detect signal by outputting a logic high. When the output enable signal is asserted and data out is present, the voltage detect signals are decoded by the control logic to generate control signals to the output circuit 26. The control signals that are provided to the output circuit 26 function to configure buffer drive transistors to have a required drive strength to ensure that a ratio of P-channel and N-channel transistors in the output circuit are equally matched. The matching of P-channel and N-channel transistors ensures that the duty cycle of a transitioning output signal is approximately fifty percent for the actual value of $V_{DD}$ I/O. Similarly, when input data is being received, the input circuit 28 functions under control of control logic 24 to configure transistors in the input circuit 28 to have a predetermined trip point voltage value. The trip point percentage may be a midpoint between low-to-high and high-to-low transitions or the trip percentage may differ. For example, the trip point percentage for a low-to-high transition may be set at sixty-five percent of the voltage representing a logic one and the trip point percentage for a high-to-low transition may be set at thirty-five percent of the voltage between a logic low and a logic high.

The external leakage offset guarantee circuit 30 that will be illustrated below in FIG. 3 functions to ensure that a predetermined voltage or current is sourced or removed from the I/O pad 32 when the output circuit 26 is disabled and not providing a signal to the I/O pad 32. The external leakage offset guarantee circuit 30 functions to keep the voltage at the I/O pad 32 at a predetermined voltage to offset any external leakages from or signal sourcing by a passive external load connected to the I/O pad 32.

Figure 2:
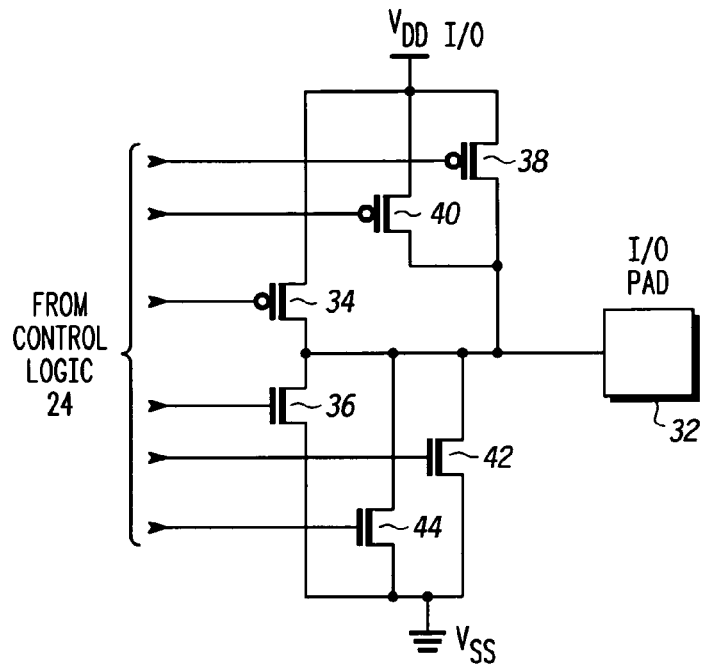
FIG. 2 illustrates in schematic form an example of the output circuit of FIG. 1.

Illustrated in FIG. 2 is a schematic detail of the output circuit 26 of FIG. 1. Reference elements that are common between FIG. 1 and FIG. 2 will be given the same reference number. A P-channel transistor 38 has a source connected to the $V_{DD}$ I/O supply voltage. A gate of transistor 38 is connected to one of the control signals from the control logic 24. A drain of transistor 38 is connected to the I/O pad 32. A P-channel transistor 40 has a source connected to the $V_{DD}$ I/O supply voltage. A drain of transistor 40 is connected to the I/O pad 32. A gate of transistor 40 is connected to another of the control signals from the control logic 24. A P-channel transistor 34 has a source connected to the $V_{DD}$ I/O supply voltage. A gate of transistor 34 is connected to yet another control signal from the control logic 24. A drain of transistor 34 is connected to the I/O pad 32. An N-channel transistor 36 has a drain connected to the I/O pad 32. A gate of transistor 36 is connected to yet another control signal from the control logic 24. A source of transistor 36 is connected to a reference voltage terminal, such as ground, labeled $V_{SS}$. An N-channel transistor 42 has a drain connected to the I/O pad 32. A gate of transistor 42 is connected to yet another control signal from the control logic 24. A source of transistor 42 is connected to a reference voltage terminal, such as ground, labeled $V_{SS}$. An N-channel transistor 44 has a drain connected to the I/O pad 32. A gate of transistor 44 is connected to yet another control signal from the control logic 24. A source of transistor 44 is connected to the reference voltage terminal $V_{SS}$.

In operation, any combination of the P-channel and N-channel transistors may be enabled by the control logic 24 as long as at least one N-channel or one P-channel transistor is made conductive when the output circuit 26 is enabled. When all of transistors 34, 38 and 40 are enabled, the P-channel transistors are coupled in parallel and when all of the transistors 36, 42 and 44 are enabled, the N-channel transistors are coupled in parallel. A net effect of the selective enablement of P-channel and N-channel transistors is to establish a predetermined desired ratio of collective impedances of the P-channel transistors and N-channel transistors for each value of $V_{DD}$ I/O that may be implemented by a user of the circuit. By establishing the ratio of the P-channel and N-channel transistors, two waveform electrical characteristics are substantially controlled. Firstly, the rise time of a logic signal may be made to be substantially the same as the fall time of the logic signal. Secondly, the propagation delay (e.g. the point at which a transition between logic high and logic low occurs) may be established to be substantially the same over a range of voltage values that can be used for $V_{DD}$ I/O. The ratio of selected P-channel transistors and N-channel transistors will vary depending upon the value of voltage used for $V_{DD}$ I/O.

Figure 3:
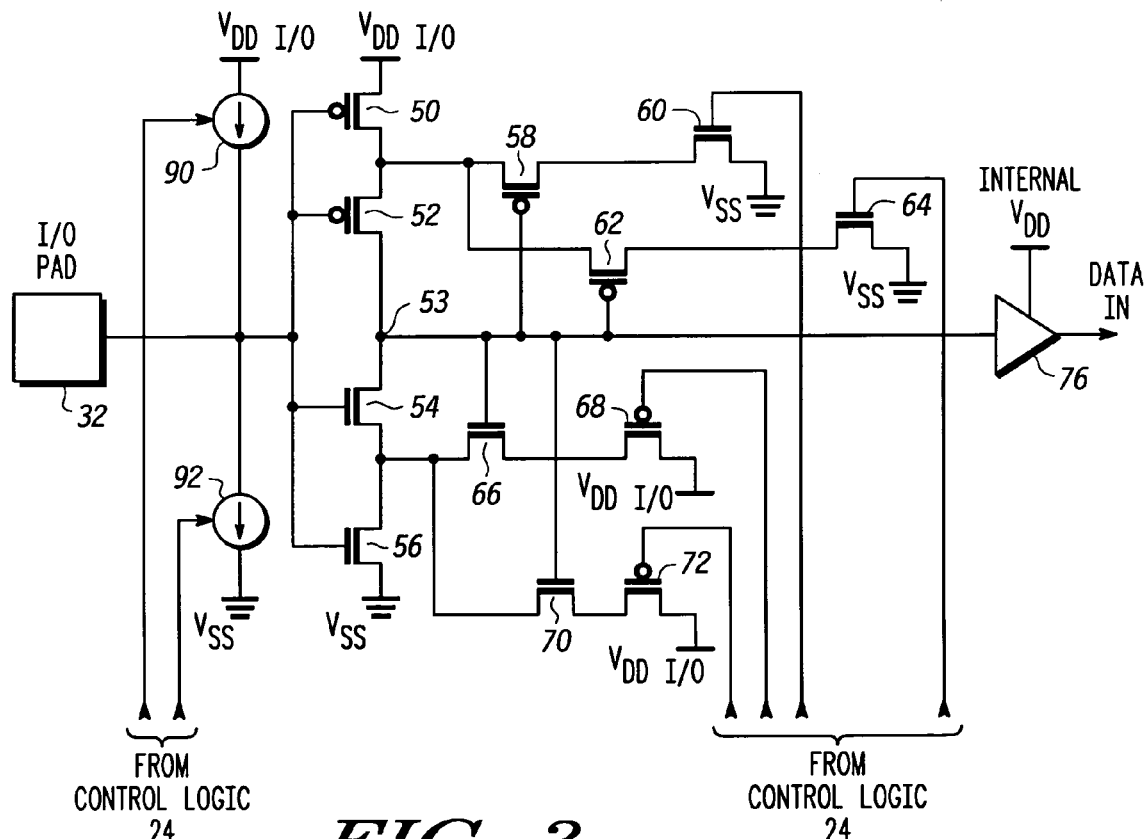
FIG. 3 illustrates in schematic form an example of the input circuit and external leakage offset guarantee circuit of FIG. 1.

Illustrated in FIG. 3 is a combined schematic of the input circuit 28 and the external leakage offset guarantee circuit 30 of FIG. 1. Reference elements that are common between FIG. 1 and FIG. 3 will be given the same reference number. A P-channel transistor 50 has a source connected to the $V_{DD}$ I/O voltage terminal. A drain of transistor 50 is connected to a source of a P-channel transistor 52. A drain of transistor 52 is connected at a node 53 to a drain of an N-channel transistor 54. A source of transistor 54 is connected to a drain of an N-channel transistor 56. A source of transistor 56 is connected to a reference voltage terminal labeled $V_{SS}$. Each of transistors 50, 52, 54 and 56 has a gate connected to the I/O pad 32. A P-channel transistor 58 has a source connected to the drain of transistor 50 and to a source of a P-channel transistor 52. A drain of transistor 58 is connected to a drain of an N-channel transistor 60. A source of transistor 60 is connected to the reference voltage terminal $V_{SS}$. A gate of transistor 60 is connected to one of the control signals from the control logic 24. An N-channel transistor 64 has a drain connected to the drain of transistor 62. A source of transistor 62 is connected to the source of transistor 58. A source of transistor 64 is connected to the reference voltage terminal $V_{SS}$. A gate of transistor 64 is connected to one of the control signals from the control logic 24. A gate of transistor 58 and a gate of transistor 62 are connected to node 53 and to an input of a level shifting buffer 76 that is referenced to an internal $V_{DD}$ supply voltage that is typically less in value than the $V_{DD}$ I/O voltage. An output of the level shifting buffer 76 provides the Data In signal. An N-channel transistor 66 has a source connected to the source of transistor 54 and has a gate connected to node 53. A drain of transistor 66 is connected to a drain of a P-channel transistor 68. A gate of transistor 68 is connected to a predetermined control signal from control logic 24. A source of transistor 68 is connected to the $V_{DD}$ I/O supply voltage. An N-channel transistor 70 has a source connected to the source of transistor 54. A gate of transistor 70 is connected to node 53, and transistor 70 has a drain connected to a drain of a P-channel transistor 72. A gate of transistor 72 is connected to a predetermined control signal from control logic 24. A source of transistor 72 is connected to the supply voltage $V_{DD}$ I/O. A controlled current source 90 has a first terminal connected to the $V_{DD}$ I/O supply voltage and a second terminal connected to the I/O pad 32 and to a first terminal of a controlled current source 92. A control terminal of the controlled current source 90 receives a control signal from the control logic 24. A second terminal of the controlled current source 92 is connected to the reference voltage terminal $V_{SS}$. A control input of controlled current source 92 also receives a control signal from the control logic 24.

In operation, an input signal is received at the I/O pad 32. The input signal biases transistors 50, 52, 54 and 56.

Depending upon whether the input signal is a logic high or a logic low signal, transistors 50 and 52 are conductive or transistors 54 and 56 are conductive. Therefore, node 53 is either a logic high (when transistors 50 and 52 are conductive) or a logic low (when transistors 54 and 56 are conductive). The logic value at node 53 functions to bias transistors 58 and 62 to be conductive or non-conductive. Similarly, the logic value at node 53 functions to bias transistors 66 and 70 to be non-conductive or conductive. Control logic 24 is, in one form, implemented so that only one of transistor 60 or 64 is made conductive. When transistor 60 is conductive and node 53 is a logic low, transistor 58 is also conductive. In this circuit condition, transistors 58 and 60 set the high-to-low signal transition trip point to a first predetermined value. Similarly, when transistor 64 is conductive and node 53 is a logic low, transistor 62 is also conductive. In this circuit condition, transistors 62 and 64 set the high-to-low signal transition trip point to a second predetermined value.

Similarly, only one of transistor 68 or transistor 72 is made conductive. When transistor 68 is conductive and node 53 is a logic high, transistor 66 is also conductive. In this circuit condition, transistors 66 and 68 set the low-to high signal transition trip point to a first predetermined value. Similarly, when transistor 72 is conductive and node 53 is a logic high, transistor 70 is also conductive. In this circuit condition, transistors 70 and 72 set the low-to-high signal transition trip point to a second predetermined value. Therefore, it should be apparent that the input circuit 28 is able to dynamically change the input signal trip point voltage value for both the low-to-high and high-to-low transitions. This setting is the same as setting the hysteresis wherein "hysteresis" is defined as a difference in voltage between the value of the low-to-high trip point and the high-to-low trip point. It is advantageous that the hysteresis not be zero as some amount of hysteresis prevents erroneous switching when noise is present and causes inadvertent switching due to a short-term transition across the trip point. Regardless of the selected value of voltage for $V_{DD}$ I/O, the hysteresis as a percentage differential should remain constant. The Hysteresis Select signal that is input to control logic 24 functions to modify hysteresis in the input circuit 28 and is a signal that is decoded by the control logic 24 to provide control signals that selectively turn on (i.e. make conductive) certain transistors in the input circuit 28 that modify the amount of hysteresis.

The controlled current source 90 and controlled current source 92 function, in response to control logic 24, to sink or source current into the I/O pad 32. Control logic 24 provides the illustrated control signals in response to the Leakage Offset Select signal of FIG. 1. When the output circuit 26 is disabled by the Output Enable signal, the I/O pad 32 is forced to a predetermined state by one of controlled current source 90 which functions as a pull-up or controlled current source 92 which functions as a pull-down. This function eliminates an undesired potential ambiguity for the I/O pad 32 when no signal is otherwise present at the I/O pad 32. In other words, the control logic 24 asserts the control signals to controlled current source 90 and controlled current source 92 to force the I/O pad 32 to a known state. One of controlled current source 90 or 92 is made conductive and the other is made non-conductive. It should be noted that the controlled current sources 90 and 92 may be continuously operative and overridden by the presence of a signal at the I/O pad 32. Also, the current drive and current sink capability of controlled current source 90 and controlled current source 92, respectively, are varied in form as a function of the value of voltage selected for $V_{DD}$ I/O.

Figure 4:
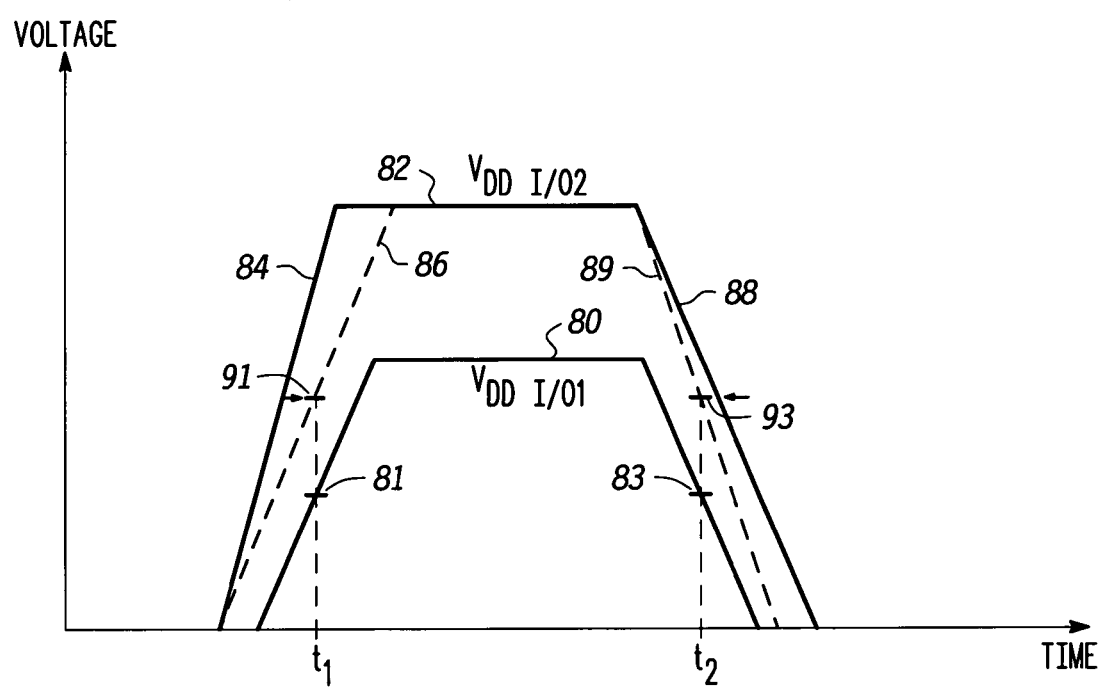
FIG. 4 illustrates in graphical form exemplary waveforms associated with an I/O pad of a buffer circuit.

Illustrated in FIG. 4 is a graph illustrating a logic signal transition of two output signals being provided at the I/O pad 32. For a first output signal, an I/O supply voltage of $V_{DD}$ I/O 1 was selected. For a second output signal, an I/O supply voltage of $V_{DD}$ I/O 2 was selected. The output signal using $V_{DD}$ I/O 1 has a rising edge in which the midpoint is illustrated as midpoint 81 occurring at time t1. The signal reaches the supply voltage $V_{DD}$ I/O 1 in section 80. A transition back to a logic low occurs. During the transition to a low logic value, a midpoint 83 is illustrated occurring at time t2. Assume now that the output buffer is used having a higher I/O supply voltage labeled $V_{DD}$ I/O 2. Assume that because $V_{DD}$ I/O 2 is higher, the transition from a logic low to a logic high begins slightly earlier in time than the first signal discussed. The output circuit is controlled by control logic 24 to adjust the natural rising edge of slope 84 to a slope represented by rising edge 86 so that the midpoint of edge 86 occurs at midpoint 91 at time t1. It is desired that the midpoint occur at time t1 for all rising edges of the I/O pad circuit 10 regardless of what supply voltage is used. This feature keeps the propagation delays of I/O pad circuit 10 the same regardless of what supply voltage is used. Similarly, it is desired that the midpoint of the high-to-low signal transition occurs at time t2. Therefore, control logic 24 will vary the transistor ratios of output circuit 26 so that the falling slope 88 is modified to occur earlier. It should be appreciated that the illustrated angle of the slope 88 is slower than the decreasing slope of the lower supply voltage curve. The increase in the value of the supply voltage results in the P-channel transistors being able to switch to a logic high somewhat faster than the N-channel transistors are able to discharge the output I/O pad 32 to a ground potential. Therefore the slopes of slope 84 and slope 88 are not symmetric. Control logic 24 changes the N-channel transistor biasing to shift the falling slope of the $V_{DD}$ I/O 2 slope and cause the midpoint 93 to occur at time t2. As a result, slope 89 is created by the output circuit 26 having midpoint 93 that occurs at the same time t2 that the midpoint 83 occurred for the lower valued supply voltage $V_{DD}$ I/O 1.

By now it should be appreciated that there has been provided an I/O buffer that is able to maintain consistent electrical characteristics while being able to operate at a plurality of differing supply voltage values. The circuit is able to dynamically modify driver and receiver characteristics for each of different supply voltages that are used. As a result, the circuit can be used in connection with a variety of differing circuit applications and processes without changing the design to compensate for using a higher supply voltage, such as 3.3 volts to 5.0 volts or a lower supply voltage, such as 1.0 volt or less to 3.3 volts. The I/O buffer is able to dynamically change physical characteristics such as slew rate, signal rise and fall times and constant duty cycle regardless of which one of multiple I/O circuit supply voltage values is used. The constant duty cycle is obtained by forcing all rising and falling edges to have a midpoint at the same point in time. The duty cycle therefore can be kept as close to a desired percent as possible. Another parameter that can be controlled by control logic 24 is to have substantially constant rise and fall times at all voltages rather than ensuring a same duty cycle for all voltages. Different ratios of P-channel and N-channel transistors can be selected to obtain the constant rise and fall times as distinguished from the ratios used for the constant duty cycle. Selection of whether to emphasize a constant duty cycle or a constant rise and fall time or constant slew rate over various supply voltages depends on the application of the I/O circuitry. A single integrated circuit may emphasize different parameters to maintain constant at differing portions of the integrated circuit.

In one form there is herein provided a method for adjusting input/output (I/O) characteristics of an I/O pad circuit across different I/O supply voltages. An I/O supply voltage being supplied to the I/O pad circuit is detected. Portions of the I/O pad circuit are enabled or disabled in response to the detected I/O supply voltage, wherein the enabling or disabling of portions of the I/O pad circuit adjusts the I/O characteristics of the I/O pad circuit as a function of the detected I/O supply voltage. The I/O pad circuit characteristics are adjusted by maintaining the I/O characteristics. I/O pad circuit characteristics specified at a first I/O supply voltage are substantially maintained at a second I/O supply voltage different from the first I/O supply voltage. In one form the I/O characteristics include one or more of output voltage rise and fall time, output voltage slew rate, output signal duty cycle, input signal DC threshold levels, input signal hysteresis, or a prescribed current supplied to the I/O pad. In another form the different I/O supply voltages are two or more of a nominal 1.8 volts, a nominal 2.5 volts, a nominal 3.3 volts, or a nominal 5.0 volts, further wherein the nominal 1.8 volts is a range of 1.62–1.98 volts, the nominal 2.5 volts is a range of 2.30–2.70 volts, the nominal 3.3 volts is a range of 3.0–3.6 volts, and the nominal 5.0 volts is a range of 4.5–5.5 volts. In one form detecting the I/O supply voltage includes one of: (a) comparing the I/O supply voltage to a reference voltage and outputting a voltage detect signal, the voltage detect signal having a first state indicative that the I/O supply voltage is more than the reference voltage and a second state indicative that the I/O supply voltage is less than the reference voltage, or (b) comparing the I/O supply voltage to a plurality of reference voltages and outputting corresponding voltage detect signals, the voltage detect signals having a first state indicative that the I/O supply voltage is more than a corresponding reference voltage and a second state indicative that the I/O supply voltage is less than the corresponding reference voltage. In another form detecting the I/O supply voltage is one of (a) inputting the I/O supply voltage to a voltage divider and providing an output of the voltage divider to a first input of a comparator, wherein the voltage divider is configured for outputting a ratio of the I/O supply voltage, and inputting a reference voltage to a second input of the comparator, wherein the comparator outputs a voltage detect signal, the voltage detect signal having a first state indicative that the voltage divider output is more than the reference voltage and a second state indicative that the voltage divider output is less than the reference voltage, or (b) inputting the I/O supply voltage to a plurality of voltage dividers and providing an output of the each of the plurality of voltage dividers to a first input of each of a plurality of comparators, and inputting a reference voltage to a second input of each of the plurality of comparators, wherein the plurality of voltage dividers are configured for outputting different ratios of the I/O supply voltage, and wherein each of the plurality of comparators outputs a voltage detect signal, the voltage detect signal of each of the plurality of comparators having a first state indicative that the corresponding voltage divider output is more than the reference voltage and a second state indicative that the corresponding voltage divider output is less than the reference voltage.

In another form the I/O pad circuit includes control logic and one or more of (i) an output circuit portion, (ii) an input circuit portion, or (iii) an external leakage offset guarantee portion. In one form enabling or disabling further includes (a) enabling the output circuit portion while disabling the input circuit portion and the external leakage offset guarantee portion, or (b) enabling the input circuit portion while disabling the external leakage offset guarantee portion and the output circuit portion, or (c) enabling the external leakage offset guarantee portion while disabling the input circuit portion and the output circuit portion, or (d) enabling one or more of the output circuit portion or the external leakage offset guarantee portion while disabling the input circuit portion, or (e) enabling one or more of the input circuit portion or the external leakage offset guarantee portion while disabling the output circuit portion, or (f) enabling one or more of the input circuit portion or the output circuit portion while disabling the external leakage offset guarantee portion.

In another form enabling the output circuit portion includes adjusting an output device size of the output circuit portion as a function of the detected I/O supply voltage, further wherein enabling the input circuit portion includes adjusting an input device size of the input circuit portion as a function of the detected I/O supply voltage, and further wherein enabling the external leakage offset guarantee portion includes adjusting a device size of the external leakage offset guarantee portion as a function of the detected I/O supply voltage. In yet another form with respect to the output circuit portion, one or more of output voltage rise and fall time, output voltage slew rate or output signal duty cycle is maintained, wherein with respect to the input circuit portion, one or more of a prescribed hysteresis or a prescribed input threshold is maintained. The input threshold includes one or more of a low point threshold and a high point threshold, and with respect to the external leakage offset guarantee portion, a prescribed current supplied to the I/O pad is maintained.

In yet another form there is provided a method for adjusting input/output (I/O) characteristics of an I/O pad circuit across different I/O supply voltages. An I/O supply voltage being supplied to the I/O pad circuit is detected. Portions of the I/O pad circuit are enabled or disabled in response to the detected I/O supply voltage, wherein the I/O pad circuit includes control logic and one or more of (i) an output circuit portion, (ii) an input circuit portion, or (iii) an external leakage offset guarantee portion. Enabling or disabling portions of the I/O pad circuit adjusts the I/O characteristics of the I/O pad circuit as a function of the detected I/O supply voltage. The I/O characteristics specified at a first I/O supply voltage are substantially maintained at a second I/O supply voltage different from the first I/O supply voltage.

In one form detecting the I/O supply voltage includes one of (a) comparing the I/O supply voltage to a reference voltage and outputting a voltage detect signal, the voltage detect signal having a first state indicative that the I/O supply voltage is more than the reference voltage and a second state indicative that the I/O supply voltage is less than the reference voltage, or (b) comparing the I/O supply voltage to a plurality of reference voltages and outputting corresponding voltage detect signals, the voltage detect signals having a first state indicative that the I/O supply voltage is more than a corresponding reference voltage and a second state indicative that the I/O supply voltage is less than the corresponding reference voltage.

In another form enabling or disabling further includes one of (a) enabling the output circuit portion while disabling the input circuit portion and the external leakage offset guarantee portion, or (b) enabling the input circuit portion while disabling the external leakage offset guarantee portion and the output circuit portion, or (c) enabling the external leakage offset guarantee portion while disabling the input circuit portion and the output circuit portion, or (d) enabling one or more of the output circuit portion or the external leakage offset guarantee portion while disabling the input circuit portion, or (e) enabling one or more of the input circuit portion or the external leakage offset guarantee portion while disabling the output circuit portion, or (f) enabling one or more of the input circuit portion or the output circuit portion while disabling the external leakage offset guarantee portion.

In yet another form enabling the output circuit portion includes adjusting an output device size of the output circuit portion as a function of the detected I/O supply voltage. In another form enabling the input circuit portion includes adjusting an input device size of the input circuit portion as a function of the detected I/O supply voltage, and enabling the external leakage offset guarantee portion includes adjusting a device size of the external leakage offset guarantee portion as a function of the detected I/O supply voltage. In yet another form the output circuit portion maintains one or more of output voltage rise and fall time, output voltage slew rate, or output signal duty cycle. Still further, with respect to the input circuit portion, one or more of a prescribed hysteresis or a prescribed input threshold is maintained, the input threshold including one or more of a low point threshold and a high point threshold. Still further wherein with respect to the external leakage offset guarantee portion, a prescribed current supplied to the I/O pad is maintained.

In another form there is provided an integrated circuit having an I/O pad circuit configured for adjusting input/output (I/O) characteristics of the I/O pad circuit across different I/O supply voltages. Circuitry detects an I/O supply voltage being supplied to the I/O pad circuit. Circuitry also enables or disables portions of the I/O pad circuit in response, to the detected I/O supply voltage, wherein the I/O pad circuit includes control logic and one or more of (i) an output circuit portion, (ii) an input circuit portion, or (iii) an external leakage offset guarantee portion. The enabling or disabling of portions of the I/O pad circuit adjusts the I/O characteristics of the I/O pad circuit as a function of the detected I/O supply voltage, wherein the I/O characteristics specified at a first I/O supply voltage are substantially maintained at a second I/O supply voltage different from the first I/O supply voltage.

In another form the circuitry for detecting the I/O supply voltage includes a comparator for comparing the I/O supply voltage to a reference voltage and outputting a voltage detect signal. The voltage detect signal has a first state indicative that the I/O supply voltage is more than the reference voltage and a second state indicative that the I/O supply voltage is less than the reference voltage. In yet another form the circuitry for detecting the I/O supply voltage includes a comparator for comparing the I/O supply voltage to a plurality of reference voltages and outputting corresponding voltage detect signals. The voltage detect signals have a first state indicative that the I/O supply voltage is more than a corresponding reference voltage and a second state indicative that the I/O supply voltage is less than the corresponding reference voltage. In another form the circuitry for enabling or disabling further includes (a) circuitry for enabling one or more of the output circuit portion or the external leakage offset guarantee portion while disabling the input circuit portion, or (b) circuitry for enabling one or more of the input circuit portion or the external leakage offset guarantee portion while disabling the output circuit portion, or (c) circuitry for enabling one or more of the input circuit portion or the output circuit portion while disabling the external leakage offset guarantee portion. In another form the circuitry for enabling the output circuit portion includes circuitry for adjusting an output device size of the output circuit portion as a function of the detected I/O supply voltage. Further, the circuitry for enabling the input circuit portion includes circuitry for adjusting an input device size of the input circuit portion as a function of the detected I/O supply voltage. Further, the circuitry for enabling the external leakage offset guarantee portion includes circuitry for adjusting a device size of the external leakage offset guarantee portion as a function of the detected I/O supply voltage. In yet another form the circuitry for enabling the output circuit portion maintains one or more of output voltage rise and fall time, output voltage slew rate or output signal duty cycle. The circuitry for enabling the input circuit portion maintains one or more of a prescribed hysteresis or a prescribed input threshold, and the input threshold includes one or more of a low point threshold and a high point threshold. The circuitry for enabling the external leakage offset guarantee portion maintains a prescribed current supplied to the I/O pad.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. To the extent that such modifications and variations do not depart from the spirit of the invention, they are intended to be included within the scope thereof which is assessed only by a fair interpretation of the following claims.

What is claimed is:

1. A method for adjusting input/output (I/O) characteristics of an I/O pad circuit having an I/O pad, comprising:
   selecting one of a plurality of different I/O supply voltages to power the I/O pad circuit, wherein the different I/O supply voltages comprise two or more of a nominal 1.8 volts, a nominal 2.5 volts, a nominal 3.3 volts, or a nominal 5.0 volts, further wherein the nominal 1.8 volts comprises a range of 1.62–1.98 volts, the nominal 2.5 volts comprises a range of 2.30–2.70 volts, the nominal 3.3 volts comprises a range of 3.0–3.6 volts, and the nominal 5.0 volts comprises a range of 4.5–5.5 volts;
   detecting an I/O supply voltage being supplied to the I/O pad circuit by detecting whether a value of the I/O supply voltage is greater than or less than a known reference voltage; and
   enabling or disabling portions of the I/O pad circuit in response to the detected I/O supply voltage, wherein enabling or disabling portions of the I/O pad circuit adjusts the I/O characteristics of the I/O pad circuit as a function of the detected I/O supply voltage.

2. The method of claim 1, further comprising:
dividing the I/O supply voltage into a plurality of divided voltages using one or more voltage dividers and comparing each of the plurality of divided voltages with the known reference voltage; and
using results of the comparing as detection control signals to control the enabling or disabling of the portions of the I/O pad circuit.

3. The method of claim 1, wherein the I/O characteristics include one or more of output voltage rise and fall time, output voltage slew rate, output signal duty cycle, input signal DC threshold levels, input signal hysteresis, or a prescribed current supplied to the I/O pad.

4. The method of claim 1, wherein detecting the I/O supply voltage comprises one of
(a) comparing the I/O supply voltage to a reference voltage and outputting a voltage detect signal, the voltage detect signal having a first state indicative that the I/O supply voltage is more than the reference voltage and a second state indicative that the I/O supply voltage is less than the reference voltage, or
(b) comparing the I/O supply voltage to a plurality of reference voltages and outputting corresponding voltage detect signals, the voltage detect signals having a first state indicative that the I/O supply voltage is more than a corresponding reference voltage and a second state indicative that the I/O supply voltage is less than the corresponding reference voltage.

5. The method of claim 1, wherein detecting the I/O supply voltage comprises one of
(a) inputting the I/O supply voltage to a voltage divider and providing an output of the voltage divider to a first input of a comparator, wherein the voltage divider is configured for outputting a ratio of the I/O supply voltage, and inputting a reference voltage to a second input of the comparator, wherein the comparator outputs a voltage detect signal, the voltage detect signal having a first state indicative that the output of the voltage divider is more than the reference voltage and a second state indicative that the voltage divider output is less than the reference voltage, or
(b) inputting the I/O supply voltage to a plurality of voltage dividers and providing an output of each of the plurality of voltage dividers to a first input of each of a plurality of comparators, and inputting a reference voltage to a second input of each of the plurality of comparators, wherein the plurality of voltage dividers are configured for outputting different ratios of the I/O supply voltage, and wherein each of the plurality of comparators outputs a voltage detect signal, the voltage detect signal of each of the plurality of comparators having a first state indicative that a corresponding voltage divider output is more than the reference voltage and a second state indicative that the corresponding voltage divider output is less than the reference voltage.

6. A method for adjusting input/output (I/O) characteristics of an I/O pad circuit having an I/O pad, control logic and at least one of (i) an output circuit portion, (ii) an input circuit portion, or (iii) an external leakage offset guarantee portion, comprising:
selecting one of a plurality of different I/O supply voltages to power the I/O pad circuit;
detecting an I/O supply voltage being supplied to the I/O pad circuit; and
enabling or disabling portions of the I/O pad circuit in response to the detected I/O supply voltage, wherein enabling or disabling portions of the I/O pad circuit adjusts the I/O characteristics of the I/O pad circuit as a function of the detected I/O supply voltage and further comprises one of:
(a) enabling the output circuit portion while disabling the input circuit portion and the external leakage offset guarantee portion, or
(b) enabling the input circuit portion while disabling the external leakage offset guarantee portion and the output circuit portion, or
(c) enabling the external leakage offset guarantee portion while disabling the input circuit portion and the output circuit portion, or
(d) enabling one or more of the output circuit portion or the external leakage offset guarantee portion while disabling the input circuit portion, or
(e) enabling one or more of the input circuit portion or the external leakage offset guarantee portion while disabling the output circuit portion, or
(f) enabling one or more of the input circuit portion or the output circuit portion while disabling the external leakage offset guarantee portion.

7. The method of claim 6, further wherein enabling the output circuit portion comprises adjusting an output device size of the output circuit portion as a function of the detected I/O supply voltage, further wherein enabling the input circuit portion comprises adjusting an input device size of the input circuit portion as a function of the detected I/O supply voltage, and further wherein enabling the external leakage offset guarantee portion comprises adjusting a device size of the external leakage offset guarantee portion as a function of the detected I/O supply voltage.

8. The method of claim 7, still further wherein with respect to the output circuit portion, maintaining one or more of output voltage rise and fall time, output voltage slew rate or output signal duty cycle, still further wherein with respect to the input circuit portion, maintaining one or more of a prescribed hysteresis or a prescribed input threshold, the input threshold including one or more of a low point threshold and a high point threshold, and still further wherein with respect to the external leakage offset guarantee portion, maintaining a prescribed current supplied to the I/O pad.

9. A method for adjusting input/output (I/O) characteristics of an I/O pad circuit across different I/O supply voltages comprising:
detecting an I/O supply voltage being supplied to the I/O pad circuit; and
enabling or disabling portions of the I/O pad circuit in response to the detected I/O supply voltage, wherein the I/O pad circuit includes control logic and one or more of (i) an output circuit portion, (ii) an input circuit portion, or (iii) an external leakage offset guarantee portion, and wherein enabling or disabling portions of the I/O pad circuit adjusts the I/O characteristics of the I/O pad circuit as a function of the detected I/O supply voltage, wherein the I/O characteristics specified at a first I/O supply voltage are substantially maintained at a second I/O supply voltage different from the first I/O supply voltage, the enabling or disabling further comprising one of:
(a) enabling the output circuit portion while disabling the input circuit portion and the external leakage offset guarantee portion, or (b) enabling the input circuit portion while disabling the external leakage offset guarantee portion and the output circuit portion, or (c) enabling the external leakage offset guarantee portion while disabling the input circuit portion and the output circuit portion, or (d) enabling one or more of the output circuit portion or the external leakage offset guarantee portion while disabling the input circuit portion, or (e) enabling one or more of the input circuit portion or the external leakage offset guarantee portion while disabling the output circuit portion, or (f) enabling one or more of the input circuit portion or the output circuit portion while disabling the external leakage offset guarantee portion.

10. The method of claim 9, wherein detecting the I/O supply voltage comprises one of:

(a) comparing the I/O supply voltage to a reference voltage and outputting a voltage detect signal, the voltage detect signal having a first state indicative that the I/O supply voltage is more than the reference voltage and a second state indicative that the I/O supply voltage is less than the reference voltage, or (b) comparing the I/O supply voltage to a plurality of reference voltages and outputting corresponding voltage detect signals, the voltage detect signals having a first state indicative that the I/O supply voltage is more than a corresponding reference voltage and a second state indicative that the I/O supply voltage is less than the corresponding reference voltage.

11. The method of claim 9, further wherein enabling the output circuit portion includes adjusting an output device size of the output circuit portion as a function of the detected I/O supply voltage, further wherein enabling the input circuit portion includes adjusting an input device size of the input circuit portion as a function of the detected I/O supply voltage, and further wherein enabling the external leakage offset guarantee portion includes adjusting a device size of the external leakage offset guarantee portion as a function of the detected I/O supply voltage.

12. The method of claim 11, still further wherein with respect to the output circuit portion, maintaining one or more of output voltage rise and fall time, output voltage slew rate or output signal duty cycle, still further wherein with respect to the input circuit portion, maintaining one or more of a prescribed hysteresis or a prescribed input threshold, the input threshold including one or more of a low point threshold and a high point threshold, and still further wherein with respect to the external leakage offset guarantee portion, maintaining a prescribed current supplied to the I/O pad.

13. An integrated circuit having an I/O pad circuit with an I/O pad configured for adjusting input/output (I/O) characteristics of the I/O pad circuit across different I/O supply voltages comprising:

means for detecting an I/O supply voltage being supplied to the I/O pad circuit; and means for enabling or disabling portions of the I/O pad circuit in response to the detected I/O supply voltage, wherein the I/O pad circuit includes control logic and one or more of (i) an output circuit portion, (ii) an input circuit portion, or (iii) an external leakage offset guarantee portion, and wherein enabling or disabling portions of the I/O pad circuit adjusts the I/O characteristics of the I/O pad circuit as a function of the detected I/O supply voltage, wherein the I/O characteristics specified at a first I/O supply voltage are substantially maintained at a second I/O supply voltage different from the first I/O supply voltage, said means for enabling or disabling further comprising (a) means for enabling at least one of the output circuit portion and the external leakage offset guarantee portion while disabling the input circuit portion, or (b) means for enabling at least one of the input circuit portion and the external leakage offset guarantee portion while disabling the output circuit portion, or (c) means for enabling at least one of the input circuit portion and the output circuit portion while disabling the external leakage offset guarantee portion.

14. The integrated circuit of claim 13, wherein said means for detecting the I/O supply voltage comprises a comparator for comparing the I/O supply voltage to a reference voltage and outputting a voltage detect signal, the voltage detect signal having a first state indicative that the I/O supply voltage is more than the reference voltage and a second state indicative that the I/O supply voltage is less than the reference voltage.

15. The integrated circuit of claim 13, wherein said means for detecting the I/O supply voltage comprises a comparator for comparing the I/O supply voltage to a reference voltage and outputting corresponding voltage detect signals, the voltage detect signals having a first state indicative that the I/O supply voltage is more than a corresponding reference voltage and a second state indicative that the I/O supply voltage is less than the corresponding reference voltage.

16. The integrated circuit of claim 13, further wherein said means for enabling the output circuit portion comprise means for adjusting an output device size of the output circuit portion as a function of the detected I/O supply voltage, further wherein said means for enabling the input circuit portion comprises means for adjusting an input device size of the input circuit portion as a function of the detected I/O supply voltage, and further wherein said means for enabling the external leakage offset guarantee portion comprises means for adjusting a device size of the external leakage offset guarantee portion as a function of the detected I/O supply voltage.

17. The integrated circuit of claim 16, still further wherein said means for enabling the output circuit portion maintains one or more of output voltage rise and fall time, output voltage slew rate or output signal duty cycle, still further wherein said means for enabling the input circuit portion maintains one or more of a prescribed hysteresis or a prescribed input threshold, the input threshold comprising one or more of a low point threshold and a high point threshold, and still further wherein said means for enabling the external leakage offset guarantee portion maintains a prescribed current supplied to the I/O pad.

* * * * *